United States Patent [19]
Conte

[11] Patent Number: 5,268,812
[45] Date of Patent: Dec. 7, 1993

[54] COOLING MULTI-CHIP MODULES USING EMBEDDED HEAT PIPES

[75] Inventor: Alfred S. Conte, Hollister, Calif.

[73] Assignee: Sun Microsystems, Inc., Mountain View, Calif.

[21] Appl. No.: 961,153

[22] Filed: Oct. 15, 1992

Related U.S. Application Data

[63] Continuation-in-part of Ser. No. 749,575, Aug. 26, 1991, abandoned.

[51] Int. Cl.⁵ .............................................. H05K 7/20
[52] U.S. Cl. .............................. 361/698; 165/104.33; 174/15.2; 257/715
[58] Field of Search ............. 174/15.2, 252; 357/82; 165/80.4, 80.5, 104.26, 104.33, 905; 361/382, 385, 386–389, 400, 401, 403; 257/706, 707, 714, 715

[56] References Cited

U.S. PATENT DOCUMENTS

| | | | |
|---|---|---|---|
| 4,019,098 | 4/1977 | McCready | 361/385 |
| 4,396,936 | 8/1983 | McIver | 357/81 |
| 4,574,879 | 3/1986 | DeGree | 165/185 |
| 4,630,172 | 12/1986 | Stenerson | 361/386 |
| 4,631,636 | 12/1986 | Andrews | 361/385 |
| 4,727,455 | 2/1988 | Neidig | 361/385 |
| 4,748,495 | 5/1988 | Kucharek | 357/82 |
| 4,774,630 | 9/1988 | Reisman | 361/383 |
| 4,879,629 | 11/1989 | Tustaniwskyj | 361/385 |
| 4,966,226 | 10/1990 | Hamburgen | 165/104.26 |
| 4,982,311 | 1/1991 | Dehaine | 361/388 |
| 5,005,638 | 4/1991 | Goth | 165/80.4 |
| 5,012,386 | 4/1991 | McShane | 361/386 |
| 5,065,281 | 11/1991 | Hernandez | 361/387 |
| 5,095,404 | 3/1992 | Chao | 174/252 |

FOREIGN PATENT DOCUMENTS

| | | |
|---|---|---|
| 0194358 | 12/1985 | European Pat. Off. . |
| 0348838 | 6/1989 | European Pat. Off. . |
| 0417299A1 | 2/1990 | European Pat. Off. . |
| 1105068 | 3/1968 | United Kingdom ............. 174/252 |
| 2039416A | 1/1980 | United Kingdom . |

*Primary Examiner*—Gerald P. Tolin
*Attorney, Agent, or Firm*—Blakely Sokoloff Taylor & Zafman

[57] ABSTRACT

An apparatus is disclosed for cooling a multi-chip module using embedded heat pipes. Semiconductor chips are disposed into the multi-chip module through cavities in the module substrate. The semiconductor chips engage heat pipes embedded within the substrate. The heat pipes conduct heat away from the semiconductor chips through a heat conductive bonding layer.

5 Claims, 3 Drawing Sheets

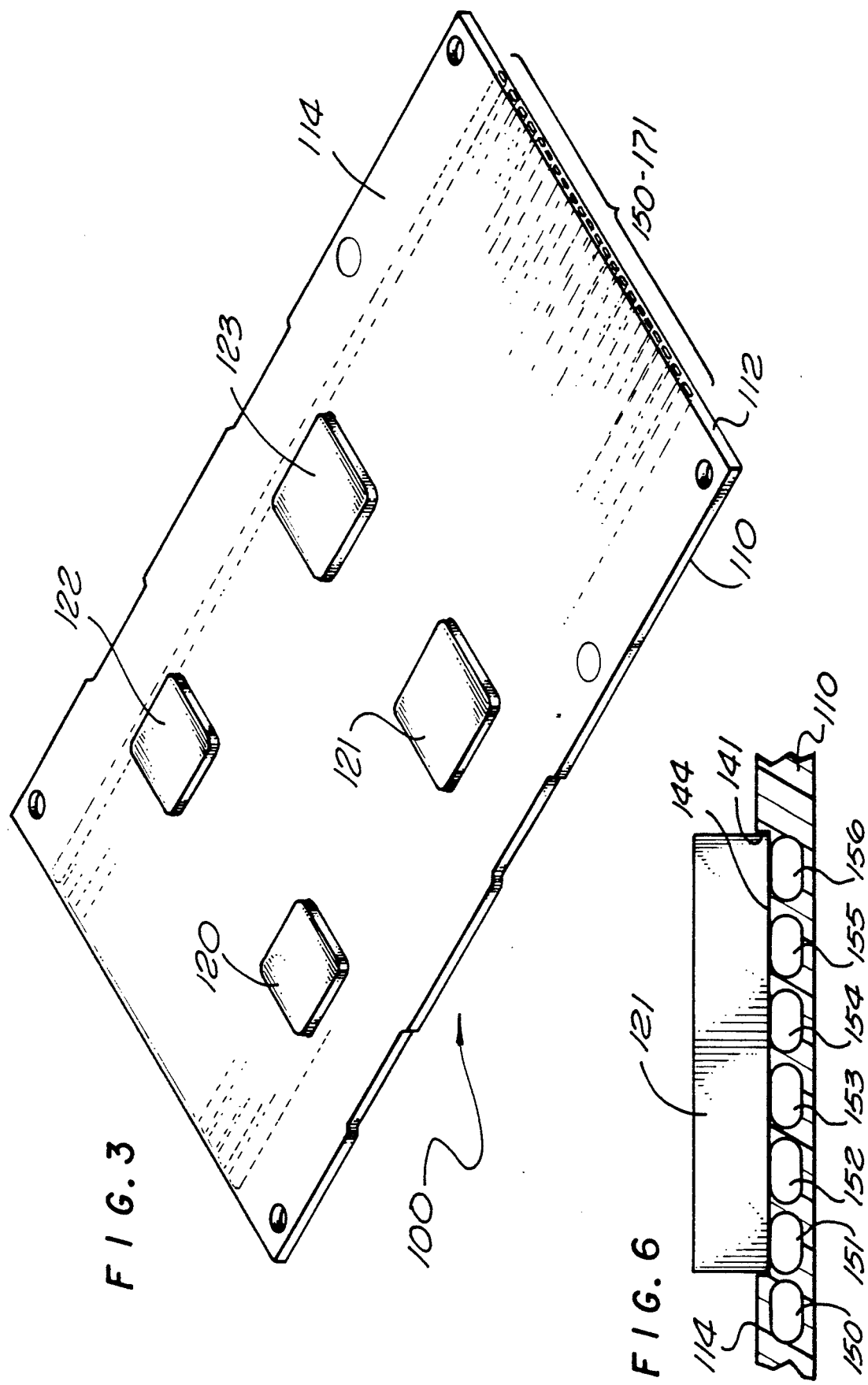

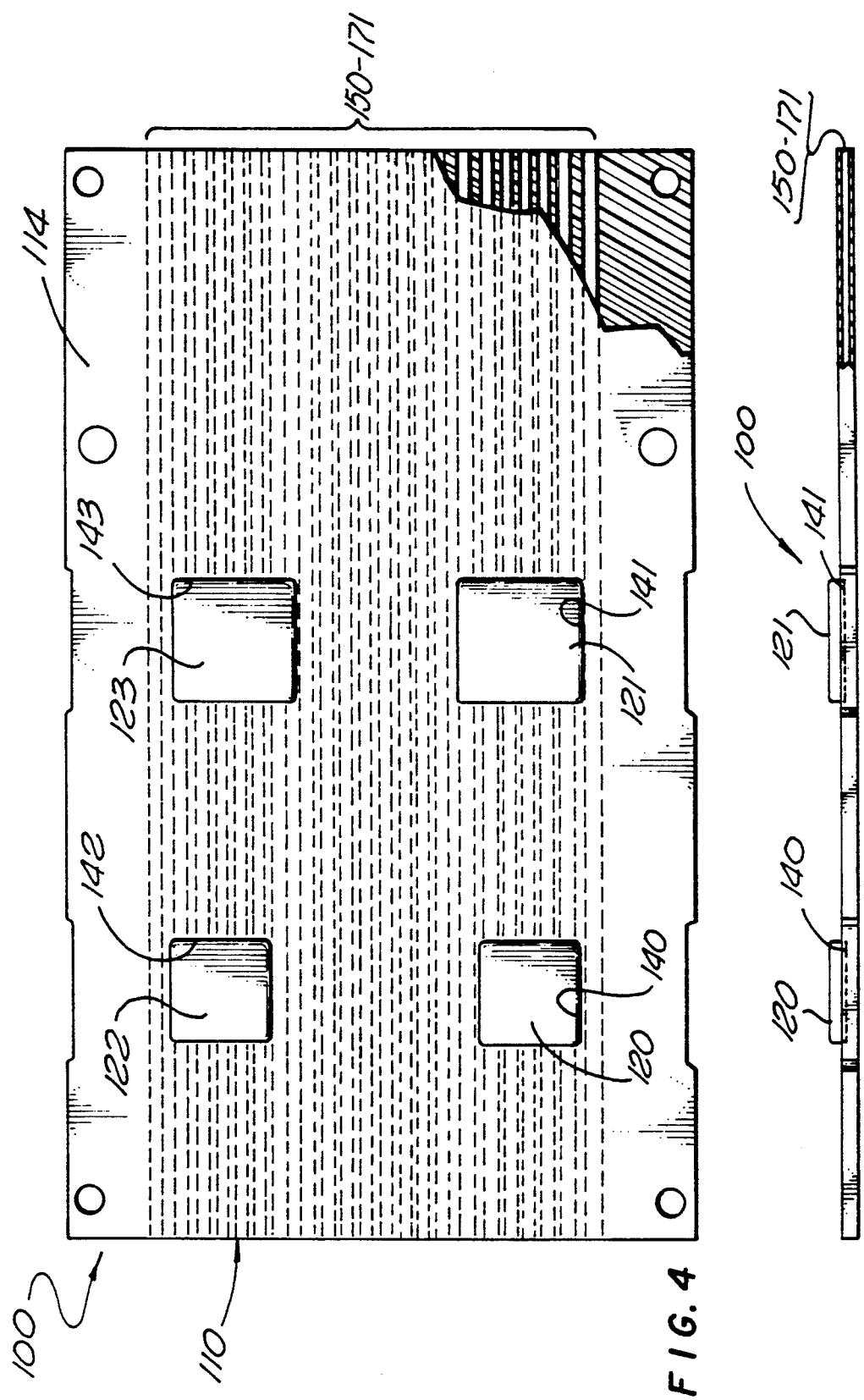

COOLING MULTI-CHIP MODULES USING EMBEDDED HEAT PIPES

RELATED APPLICATIONS

This application is a continuation-in-part of Application Ser. No. 07/749,575 now abandoned, filed on Aug. 26, 1991 and incorporates by reference the subject matter of said application herein.

BACKGROUND OF THE INVENTION

1. Field of the Invention

The present invention relates to cooling of a multi-chip module. More precisely, the present invention relates to embedding heat pipes into the substrate of a multi-chip module to cool semiconductor chips mounted on the module.

2. Art Background

An important objective of computer design is to fit the greatest number of semiconductor chips or ICs into the smallest space. Factors such as substrate design, interconnect design, cooling method, density of chip placement, etc., have great bearing on the ultimate performance of the computer. The tendency of designers to minimize the size of the computer while maximizing its computing power has led to more and more densely packed IC chips. The density of interconnects that provide the signal path between ICs must concurrently rise. Unfortunately, these densely networked interconnects have a propensity to generate heat.

By the same token, higher computing power translates to a faster rate at which instructions are executed. To execute more instructions per second, the circuits must operate at a higher frequency. Operating at a higher frequency requires higher energy input and consequently more energy is generated in the devices. A byproduct of high energy input is heat.

Higher computing power also means the ability to execute larger and larger sets of instructions. As a result, the semiconductor devices used within a given area must have greater memory capacity to accommodate the increase. Thus, more energy is required to operate the increased number of memory devices. Again, more energy input results in more energy appearing as heat. It follows then that cooling of these devices should be a major concern.

In prior art computers, the circuits were simply cooled by air convection circulated by a fan. But when the fan was used in conjunction with high density, multi-chip, main frame computers, the large volume of air needed for cooling necessitated powerful blowers and large ducts. Such clumsy structures in the computer occupied precious space and were noisy too.

There have been other approaches to cooling ICs. For example, U.S. Pat. No. 4,748,495 to Kucharek discloses a package for cooling a high density array of IC chips and their interconnections. In this arrangement, the IC chips are mounted in a generally planar array with individual heat sinks connected to the ICs separated by flexible membrane mounts. All of the cooling structure are thus mounted on top of the ICs, separated by the membrane mounts. Cooling fluid is then pumped through the cooling structures, thus carrying coolant past the areas above the ICs.

Likewise, U.S. Pat. No. 4,879,629 to Tustaniwskyj et al. discloses a liquid cooled multi-chip integrated circuit module that incorporates a seamless compliant member for leak proof operation. In particular, heat sinks are disposed immediately on top of the ICs while on top of the heat sinks are disposed channels that carry liquid coolant wherein the channel is incorporated into a rigid cover. A compliant member seals off the channel area from the chip area to eliminate the possibility of leakage of liquid coolant.

Because of variations in the way ICs are mounted to the substrate, the top surface of the IC may be tilted at different angles which impairs heat conduction to the heat sink. U.S. Pat. No. 5,005,638 to Goth et al. provides structure to ensure solid contact between the heat sink and the IC. Goth discloses barrel shaped pistons that are spring loaded and biased toward the IC chips such that any minor tilt in the chips are compensated by the springs. Heat then rises from the IC chips up through the barrel shaped pistons and into a large body heat sink. Coolant is then pumped through the heat sink to assist in heat dissipation.

Unfortunately, with the coolant fluid disposed above the chips as in the prior art, there is always a possibility of coolant leakage. If such leakage should take place, assuming the coolant is electrically conductive, the malfunction would be catastrophic. Even if the coolant were not conductive, it would contaminate the chips leading to other reliability problems. Furthermore, the structures needed for conduction of fluid and contact between the heat sink and the chips are typically very complex. These intricate structures require a great deal of attention during assembly and are usually expensive to fabricate.

Finally, U.S. Pat. No. 5,095,404 to Chao discloses a cooling apparatus mounted to a printed circuit board. The printed circuit board has a hole for receiving the cooling apparatus comprising several layers including a heat spreader, a heat pipe, and heat sinks. The heat spreader engages a semiconductor chip through the hole in the printed circuit board. The heat spreader is mounted to the under side of the printed circuit board, and the heat pipe is mounted to the heat spreader through intervening layers. Heat sinks are coupled to the heat pipe. Unfortunately, such a multi-layer cooling apparatus does not conduct heat efficiently since each layer adds a resistive barrier to heat conduction. Moreover, such an externally mounted cooling apparatus increases the space required by the printed circuit board, thereby increasing the overall form factor of the system containing the printed circuit board.

SUMMARY OF THE INVENTION

The present invention is a method and apparatus for cooling a multi-chip module using embedded heat pipes. The embedded heat pipes conduct heat away from semiconductor chips that are disposed into the multi-chip module through cavities in the module substrate.

For one embodiment, a module cooling apparatus comprises a substrate having an integral thermal conduction layer coupled to a heat pipe. The substrate is formed with a plurality of cavities for receiving semiconductor chips through a top face of the substrate. The thermal conduction layer is embedded into a bottom face of the substrate. The thermal conduction layer has a top surface for engaging with the semiconductor chips through the cavities. A heat pipe for absorbing heat from the thermal conduction layer engages a bottom surface of the thermal conduction layer. Heat generated by the semiconductor chips is conducted through the thermal conduction layer and dissipated in the heat pipe.

For another embodiment, the module cooling apparatus comprises a substrate with a plurality of heat pipes embedded within the substrate. A plurality of cavities for receiving semiconductor chips are formed through a top face of the substrate. Each of the heat pipes contained within the substrate has a top surface for engaging with the semiconductor chips through a corresponding cavity. The heat generated by the semiconductor chips is conducted through a thermoplastic bonding layer and is dissipated in the heat pipes.

BRIEF DESCRIPTION OF THE DRAWINGS

FIG. 3 is a perspective view of an example multi-chip module with a set of semiconductor chips disposed into cavities in a top face of the module substrate.

FIG. 4 is a top view of the example module, and shows the semiconductor chips disposed within a set of cavities in the top face of the substrate.

FIG. 5 is a side view of the example module showing the semiconductor chips disposed into the substrate, and showing the heat pipes embedded within the substrate and running along the length of the module.

FIG. 6 is a cross sectional view showing a portion of the example module, and showing a semiconductor chip disposed within a cavity in the module substrate.

DETAILED DESCRIPTION OF THE INVENTION

The following specification describes a method and apparatus for cooling a multi-chip module using embedded heat pipes. In this description, specific materials and configurations are set forth in order to provide a more complete understanding of the present invention. But it is understood by those skilled in the art that the present invention can be practiced without those specific details. In some instances, well-known elements are not described precisely so as not to obscure the invention.

The present invention integrates a heat pipe directly into a multi-chip module (i.e., MCM) substrate, and is thus not simply bolted on. This is distinct from the prior art, which add discrete cooling structures to the MCM substrate. By embedding the heat pipe directly to the MCM, it is much simpler for product assembly and possible rework.

An MCM package cooled by the present invention is not as prone to coolant leakage because the coolant is contained within the substrate thus minimizing the possibility of contamination with the chips. Further, the simplified construction of the cooling mechanism ensures that the present invention is less expensive to build than the prior art cooling devices. Also, positive contact between the cooling mechanism of the present invention and the IC chips results in efficient heat conduction as compared to the prior art devices that required various make-shift hardware to obtain positive contact.

Figure 1:
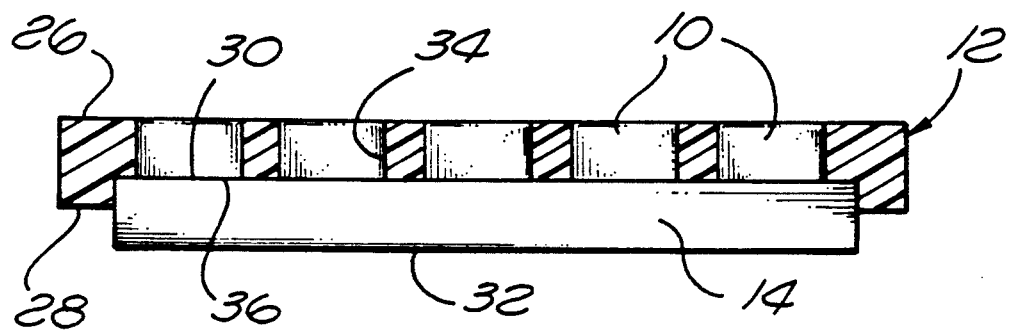
FIG. 1 is a cross-sectional view of a multi-chip module having a heat sink integrated into the substrate.

Referring now to FIG. 1, a multi-chip module just prior to installation of the heat pipe is illustrated. A packaging substrate 12 is provided to hold a plurality of semiconductor chips 10. For one embodiment, the packaging substrate 12 contains a network of cavities 34 which extend completely through the thickness of the substrate 12. Through various methods known in the art, semiconductor chips 10 are inserted into these cavities 34. Electrical interconnects (not shown) provided on the chips 10 and the packaging substrate top face 26 allow electrical communication among the chips 10 and facilitate electrical interface with external devices. For this purpose, conventional wire interconnects can be soldered to the chips 10. Or more exotic Tape Automated Bonding (TAB) techniques can be used to form the interconnects, as disclosed in U.S. Pat. No. 5,121,293 to Conte. After installation, the semiconductor chips 10 should preferably be recessed into the substrate 12 such that their bottom surfaces 36 are exposed. A thermal conduction means 14, embedded into the bottom face 28 of the packaging substrate 12, is adapted to engage the bottom surfaces 36 of the chips 10. An interference fit is sufficient to mechanically hold the thermal conduction means 14 in place. Other means of attachment such as cement, mechanical fasteners, or other means known in the art are suitable to hold the conduction means 14 in position. Positive engagement is thus obtained between the bottom 36 of each chip 10 against the thermal conduction means 14. For one embodiment, the thermal conduction means 14 is a copper slug. Clearly, other thermoconducting devices known in the art are acceptable in place of the copper slug.

A bonding process is used to insure proper heat flow from the semiconductor chip 10 to the thermal conduction means 14. This die attach process involves supplying a quantity of heat conductive thermoplastic material to join the die 10 to the thermal conduction means 14. At first, the thermoplastic material is fluid and flows to fill any voids in the joint. After curing, the bond stiffens insofar as no further flow occurs, but the joint remains flexible. For one embodiment, the thermoplastic material should be hexagonal boron nitride. Significantly, the compliant nature of the thermoplastic material maintains a solid thermal bond even when the packaging substrate 12 undergoes flexing during assembly.

For one embodiment, a heat pipe 38 dissipates heat accumulating in the thermal conduction means 14. The heat pipe 38 is preferably made from copper or aluminum. For efficient heat transfer via conduction, it is preferred that the heat pipe 38 be directly and positively attached to the thermal conduction means 14. Conventional mechanical fasteners such as clamps of screws can be used to lock the two structures together. Further, there should be no air gaps between the contacting surfaces which would impair heat conduction.

The heat pipe 38 functions similarly to a miniature refrigerator (not shown). In a typical closed circuit refrigeration cycle, the heat transfers to an evaporator which vaporizes a liquid refrigerant causing it to travel into a compressor, which in turn moves the high pressure vapor into a condenser. The condenser transfers heat out of the system and condenses the refrigerant back to liquid form. Thereafter, the condensate travels through a pressure-lowering expansion valve back into the evaporator, where the cycle repeats. The principles used here are well-known in the art and need not be explained in further detail.

Figure 2:
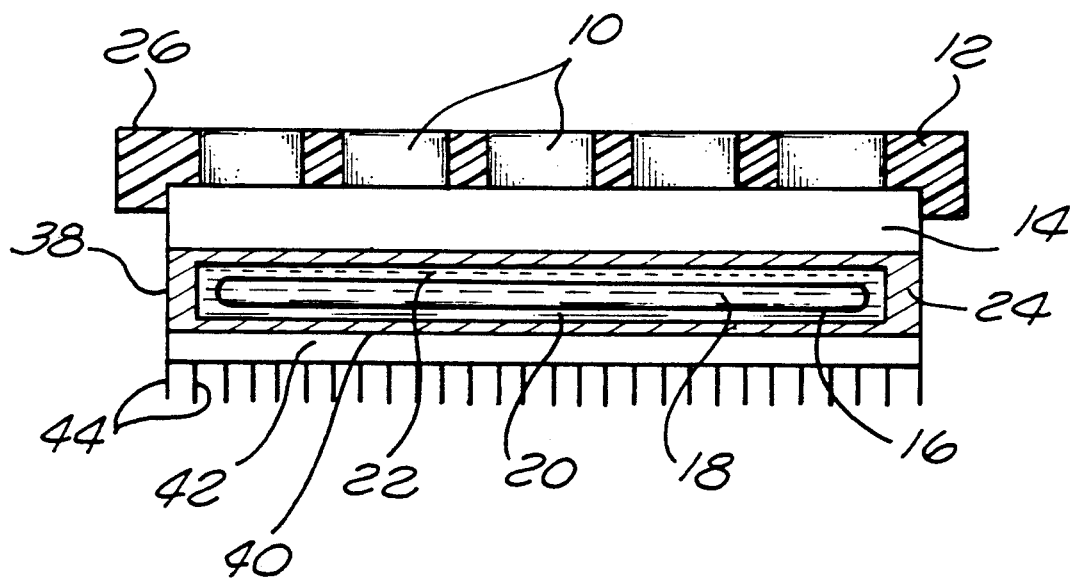
FIG. 2 is a cross-sectional view of a multi-chip module having an integrated heat pipe joined to a heat sink.

Those very same principles apply in the heat pipe 38 utilized in the present invention. Inside the hollow casing 24 of the heat pipe 38 is a chamber containing refrigerant or coolant 18 and a wick 16. For one embodiment, the coolant 18 is a dielectric fluorocarbon. As shown in FIG. 2, one side of the heat pipe 38 is placed against the bottom surface 32 of the thermal conduction means 14 while the opposite side of the heat pipe 38 faces away. The proximal region of the heat pipe 38 closest to the thermal conduction means 14 operates as an evaporator 22, while the distal region furthest away functions as a condenser 20. Accordingly, as heat travels from the thermal conduction means 14 into the evaporator 22, the coolant 18 in that region is vaporized and moves away from the evaporator 22 to the condenser 20. In the condenser 20, the vapor cools and transitions back to its liquid form after heat is dissipated through casing 24 and out through a radiating surface 40.

After condensing to liquid form, the coolant 18 is drawn through a wick 16 back to the evaporator 22 by capillary action. As is known in the art, capillary action is due to surface tension; namely, cohesion of the liquid molecules and the adhesion of the molecules on the surface of a solid. When the adhesion is greater than the cohesion, the liquid is drawn along the wick from the wet side to the dry side. Consequently, a closed loop cycle is established in that the coolant is evaporated in the evaporator 22, moves to the condenser 20 where it condenses to a liquid, and is finally drawn into the wick 16 to be carried back to the evaporator 22.

For one embodiment, the packaging substrate 12 along with the appended devices are inverted during final assembly to a motherboard (not shown). Therefore, surface 26 along with the semiconductor chips 10 all face downward toward the motherboard. As a result, the heat pipe 38 is positioned at the highest point on the substrate package 12. The condenser 20 of the heat pipe 38 is thus ideally located at a point higher in elevation than the evaporator 22. This particular orientation is conducive to optimal heat transfer and radiation away from the heat generating device 10 since heat travels upward; and as the light-weight evaporated coolant 18 rises from the evaporator 22, the denser and heavier condensed liquid form of the coolant 18 is drawn back to the evaporator 22 by gravity, as well as through operation of the wick 16. An optional second heat sink 42 with fins 44, which structure is well known in the art, can be added to the radiating surface 40. The foregoing is only one arrangement for mounting the heat pipe 38 to the thermal conduction means 14.

In an alternate arrangement (not shown), the heat pipe can extend to one side of the thermal conduction means. In this disposition, the entire region proximal to the thermal conduction means functions as a evaporator while the distal portion away from the thermal conduction means and not in engagement therewith functions as a condenser.

FIG. 3 is a perspective view of an example multi-chip module 100. The semiconductor chips 120-123 are disposed into a top face 114 of a substrate 110 through cavities. A group of heat pipes 150-171 are contained within the substrate 110. For the example module 100, the heat pipes 150-171 run along the length of the module 100.

FIG. 4 is a top view of the example module 100. The semiconductor chips 120-123 are disposed within a set of cavities 140-143 formed in the top face 114 of the substrate 110. The cavities 140-143 expose upper surfaces of the heat pipes 150-171. The semiconductor chips 120-123 are disposed into the substrate 110 and engage one or more of the heat pipes 150-171. The heat pipes 150 dissipate heat generated by the semiconductor chips 120-123. For one embodiment, it is preferable that the heat pipes 150 be made from copper or aluminum.

For one embodiment, the heat pipes 150-171 have closed ends that extend through a surface 112 of the substrate 110. However, for other embodiments, the heat pipes 150-171 are completely confined within the substrate 110 according to the thermal arrangement of the system containing the module 100.

The heat pipes 150-171 function in a similar manner to the heat pipe 38 discussed above. The heat pipes 150-171 each have a chamber containing refrigerant or coolant and a wick. For one embodiment, the coolant is a dielectric fluorocarbon. The regions of the heat pipes 150-171 closest to the semiconductor chips 120-123 function as evaporators, while the regions of the heat pipes 150-171 farthest away from the semiconductor chips 120-123 function as condensers.

Heat travels from the semiconductor chips 120-123 into the evaporators of the heat pipes 150-171. Thereafter, the coolant near the semiconductor chips 120-123 is vaporized and moves away from the evaporators toward the condensers of the heat pipes 150-171. In the condensers, the coolant vapor cools and transitions back to a liquid form as heat is dissipated through the substrate 110 and through the ends of the heat pipes 150-171 extending through the surface 112. After condensing to liquid form, the coolant is drawn through the wicks to the evaporators by capillary action, thereby establishing a closed loop cycle.

FIG. 5 is a side view of the example module 100. The semiconductor chips 120-121 are shown disposed into the top face 114 of the substrate 110. Also shown are the heat pipes 150-171 running along the length of the module 100. The semiconductor chip 120 is disposed within the cavity 140 formed in the top face 114 of the substrate 110. Similarly, the semiconductor chip 121 is disposed within the cavity 141 formed in the top face 114 of the substrate 110. The semiconductor chips 120-121 engage the upper surfaces of the heat pipes 151-156.

FIG. 6 is a cross sectional view showing a portion of the example module 100. The semiconductor chip 121 is shown disposed within the cavity 141. The cavity 141 is formed through the top face 114 of the substrate 110. Also shown are the heat pipes 150-156 as viewed through the surface 112 of the substrate 110.

A contact junction 144 is formed between the semiconductor chip 121 and the substrate 110, and between the semiconductor chip 121 and the upper surfaces of the heat pipes 151-156. The heat generated by the semiconductor chip 121 travels through the contact junction 144 and into the evaporators of the heat pipes 151-156. The heat generated by the semiconductor chip 121 is dissipated in the heat pipes 151-156 in the manner described above.

For one embodiment, a heat conductive thermoplastic material is applied to the contact junction 144 to bond the semiconductor chip 121 to the cavity 141. The heat conductive thermoplastic material also ensures efficient heat flow from the semiconductor chip 121 through the contact junction 144 to the upper surfaces of the heat pipes 151-156. At first, the thermoplastic material is fluid and flows to fill any voids in the contact junction 144. After curing, the bond stiffens insofar as no further flow occurs, but the joint remains flexible. For one embodiment, the thermoplastic material is hexagonal boron nitride. The compliant nature of the thermoplastic material maintains a solid thermal bond even when the substrate 110 undergoes flexing.

Heat pipes of other configurations known in the art are suitable and, depending upon space constraints or particular heat transfer application, their orientation can be easily varied according to the present invention. Indeed, many variations thereon are possible so the actual scope of the disclosure should be determined by reference to the appended claims.

What is claimed is:

1. An apparatus which cools semiconductor chips, comprising:
   a substrate having a top face and a bottom face, the substrate having a plurality of cavities receiving the semiconductor chips through the top face of the substrate;
   a plurality of heat pipes enclosed within the substrate between the top face and the bottom face of the substrate, the heat pipes each having a top surface directly engaging with the semiconductor chips through the cavities such that heat generated by the semiconductor chips is dissipated in the heat pipes.

2. The apparatus of claim 1, wherein the heat pipes each comprise a hollow casing containing a coolant, an evaporator portion, a condenser portion, and a wick, such that the evaporator portion defines a proximal region of the hollow casing substantially adjacent to the cavities, the condenser portion defines a distal region of the hollow casing away from the evaporator portion, the wick extends a length inside the hollow casing between the evaporator portion and the condenser portion.

3. The apparatus of claim 2, wherein the heat generated by the semiconductor chips evaporates the coolant in the evaporator portion and causes the coolant to flow to the condenser portion, and wherein the coolant in the condenser portion is drawn back into the evaporator portion through the wick according to capillary action.

4. The apparatus of claim 1, wherein the semiconductor chips are bonded to the heat pipes by a compliant, heat-conducting thermoplastic material.

5. The apparatus of claim 1, wherein each of the heat pipes has a pair of sealed ends, and at least one of the sealed ends of each heat pipe is exposed through the substrate.

* * * * *